(12) United States Patent
Kawashima et al.

(10) Patent No.: US 8,212,990 B2
(45) Date of Patent: Jul. 3, 2012

(54) EXPOSURE APPARATUS, INFORMATION PROCESSING APPARATUS, AND METHOD OF MANUFACTURING DEVICE

(75) Inventors: Jun Kawashima, Tokyo (JP); Yuji Kojima, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 602 days.

(21) Appl. No.: 12/174,915

(22) Filed: Jul. 17, 2008

(65) Prior Publication Data

US 2009/0040480 A1    Feb. 12, 2009

(30) Foreign Application Priority Data

Jul. 19, 2007    (JP) .................................. 2007-188664

(51) Int. Cl.
*G03B 27/42* (2006.01)

(52) U.S. Cl. ......................................................... 355/53
(58) Field of Classification Search ...................... 355/53
See application file for complete search history.

(56) References Cited

U.S. PATENT DOCUMENTS

2005/0179880 A1*    8/2005    Butler et al. .................... 355/53

FOREIGN PATENT DOCUMENTS

| JP | 2002-319530 A | 10/2002 |
| JP | 2004-281434 A | 10/2004 |

* cited by examiner

*Primary Examiner* — Edwaed Glick
*Assistant Examiner* — Mesfin T Asfaw
(74) *Attorney, Agent, or Firm* — Canon U.S.A., Inc. IP Division

(57) ABSTRACT

An exposure apparatus for exposing a substrate to radiant energy comprises a controller configured to determine a shot layout based on data representing a surface shape of the substrate, and an exposure unit configured to expose the substrate to the radiant energy in accordance with the shot layout determined by the controller.

13 Claims, 8 Drawing Sheets

| COORDINATES (x,y) | Z VALUE | SHOT No. |
|---|---|---|
| 3,8 (702) | 0.1 | 1 (706) |
| 4,8 (703) | 0.2 | 2 |
| 5,8 | 0.1 | 2 |
| 6,8 | 0.1 | 3 |
| 7,8 | 0.1 | 3 |
| 8,8 | 0.3 | 4 (707) |
| 2,7 (704) | 0.1 | 1 (706) |
| 3,7 | -0.2 | 1 (706) |
| 4,7 | 0.1 | 2 |
| 5,7 | 0.1 | 2 |
| 6,7 | -0.3 | 3 |
| 7,7 | 0.2 | 3 |
| 8,7 | -0.4 | 4 (707) |
| 9,7 | 0.1 | 4 (707) |
| 1,6 | 0.4 | 5 |
| 2,6 | 0.1 | 5 |
| 3,6 | 0.2 | 6 |
| 4,6 | 0.1 | 6 |
| 5,6 | 0.1 | 7 |
| 6,6 | 0.2 | 7 |
| 7,6 | 0.1 | 8 |
| 8,6 | 0.1 | 8 |
| 9,6 | 0.1 | 9 (708) |

EXPOSURE APPARATUS, INFORMATION PROCESSING APPARATUS, AND METHOD OF MANUFACTURING DEVICE

BACKGROUND OF THE INVENTION

1. Field of the Invention

The present invention relates to an exposure apparatus for exposing a substrate to radiant energy, an information processing apparatus for determining a shot layout used by the exposure apparatus, and a method of manufacturing a device using the exposure apparatus.

2. Description of the Related Art

Along with the recent demand for finer, higher-density circuit patterns, a projection exposure apparatus for manufacturing a semiconductor device is required to project a circuit pattern formed on an original (which can also be called a mask or reticle) onto a substrate (e.g., a wafer) with a higher resolving power. The apparatus is also required to improve a process performance (throughput) which can be represented by the number of substrates that can be processed per unit time, in order to obtain high productivity. Because accuracy and throughput are contradictory performance items for a general semiconductor manufacturing apparatus, a large number of measurements to increase accuracy can decrease throughput. To improve throughput while maintaining accuracy, the following techniques are available.

As the first technique, a minimum number of most effective shots (to be referred to as sample shots hereinafter) serving as samples used in measurement are designated for each type of measurement. In particular, the selection of a different shot layout for each type of measurement and as well as effective sample shots based on the given layout in one recipe decreases the number of measurements of each type to be performed.

As the second technique, the angle of view of one exposure (shot) is set relatively large. Decreasing the number of shots per substrate greatly improves the throughput of the exposure apparatus. For example, when four chip regions can be exposed by one shot, the throughput improves as compared with a case in which only one chip region is exposed by one shot.

As the third technique, two stages are used. Nowadays, two substrate stages are often built in one exposure apparatus. The two substrate stages are generally used to parallelly perform a measurement process and exposure process. When the time spent for the substrate exposure process is sufficiently longer than that for the substrate measurement process, more various types of measurement necessary for the substrate can be performed, thus allowing high-accuracy alignment and the like. Still better, the throughput becomes less likely to decrease with a large number of types of measurement.

Consider a recipe as an instruction issued to the exposure apparatus to expose a substrate. Of recipe constituent elements, shot layout designation is especially important from the viewpoint of ensuring both accuracy and the throughput. As described above, a shot layout which assigns an importance to the throughput is generally designed to increase the area of each shot region as much as possible so that the number of times of exposure per substrate decreases. However, the tilt of a substrate often differs between its central portion and peripheral portion. When all shot regions are processed using the same angle of view, the tilt cannot be followed, which may result in an unusable chip. In that case, the process engineer can, for example, edit a shot layout and continue a subsequent lot process. If the process engineer empirically knows this fact in advance, he/she may generate a shot layout by dividing a shot region that is likely to be defective into shot regions as small as the chip size in advance at the stage of creating a recipe.

However, even when a shot layout is edited, it is not always suitable because each substrate has a different surface shape. Conversely, when a shot region that has no defect in surface shape is divided, the throughput often decreases.

SUMMARY OF THE INVENTION

The present invention has been made in consideration of the above-described background, and has as its object, for example, to provide a technique of determining a shot layout which takes account of both the yield and the throughput.

According to one aspect of the present invention, there is provided an exposure apparatus for exposing a substrate to radiant energy comprising a controller configured to determine a shot layout based on data representing a surface shape of the substrate, and an exposure unit configured to expose the substrate to the radiant energy in accordance with the shot layout determined by the controller.

The present invention can provide, for example, a technique of determining a shot layout which takes account of both the yield and the throughput.

Further features of the present invention will become apparent from the following description of exemplary embodiments with reference to the attached drawings.

DESCRIPTION OF THE EMBODIMENT

A preferred embodiment of the present invention will be described below with reference to the accompanying drawings.

Figure 2:
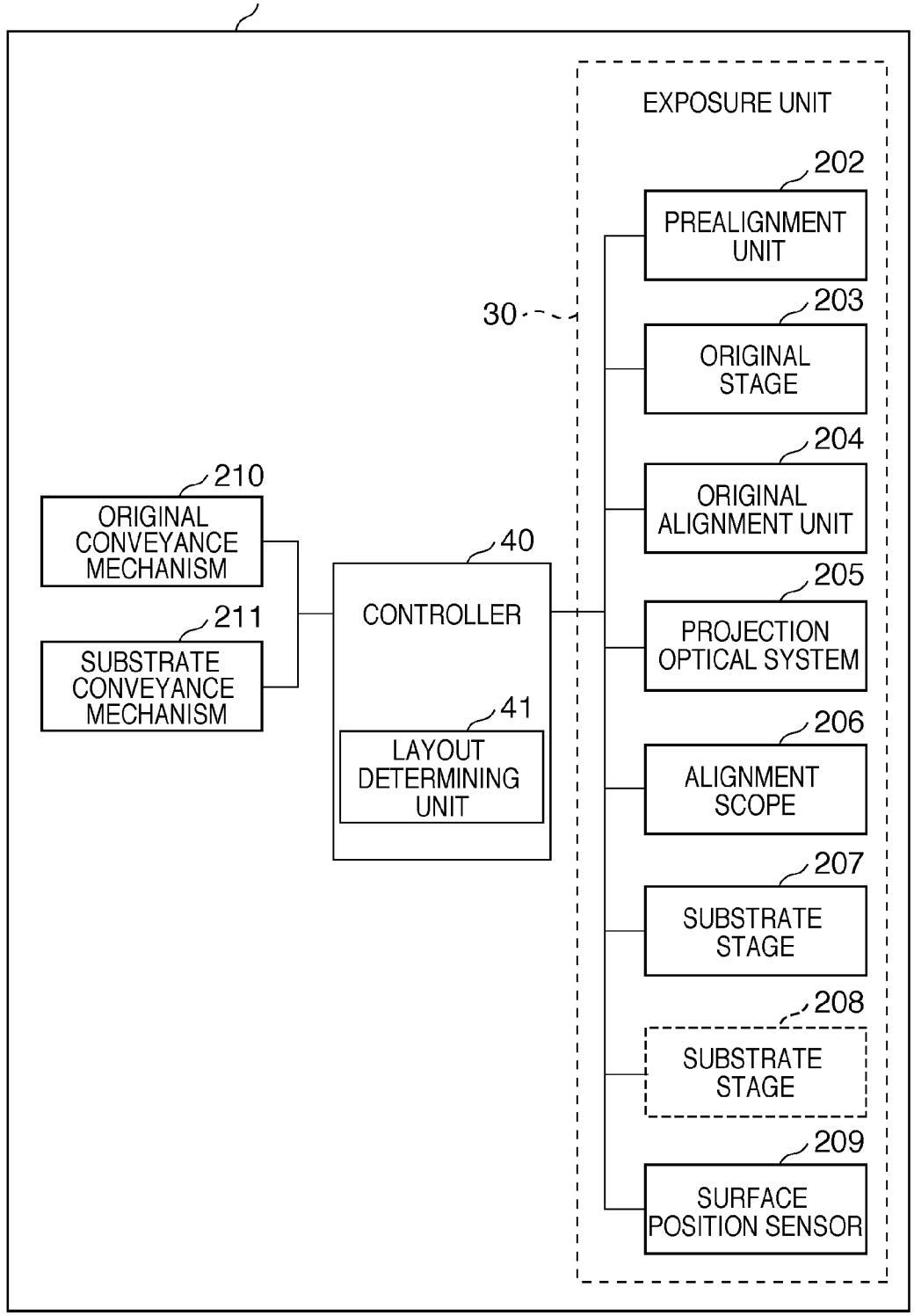
FIG. 2 is a block diagram schematically showing the arrangement of the exposure apparatus according to the preferred embodiment of the present invention.

FIG. 2 is a block diagram schematically showing the arrangement of an exposure apparatus according to the preferred embodiment of the present invention. An exposure apparatus 200 according to the preferred embodiment of the present invention projects the pattern of an original onto a substrate via a projection optical system 205, thereby exposing the substrate. The exposure apparatus 200 can comprise, for example, a controller (information processing apparatus) 40 and exposure unit 30. The exposure apparatus 200 can also comprise an original conveyance mechanism 210 and substrate conveyance mechanism 211.

The controller 40 can be configured by connecting, for example, a plurality of computer systems to which roles are assigned. The assignment of roles means that computer systems are assigned to respective processes such as the control of a built-in device, the execution of a process of providing various services, and the display of the states of device control and service execution.

The controller 40 can control the operation of the exposure unit 30 and, more specifically, a plurality of its constituent components. The controller 40 can also control the original conveyance mechanism 210 and substrate conveyance mechanism 211.

Examples of the constituent components of the exposure unit 30 are the following components 202 to 208. A prealignment unit 202 prealigns an original (reticle). An original alignment unit 204 measures an alignment mark on the original to measure the original position relative to an original stage (reticle stage) 203. On the basis of the original position measurement result obtained by the alignment unit 204, the original stage 203 corrects a positional shift of the original, and then chucks and holds it.

A projection optical system 205 projects a pattern formed on an original onto a substrate (wafer), thereby exposing the substrate. An alignment scope 206 detects an alignment mark to align the substrate. In measurement, a substrate stage (wafer stage) 207 is aligned by a driving mechanism (not shown) such that the alignment mark on the substrate comes within the field of the alignment scope 206. In exposure, the substrate stage 207 is aligned by the driving mechanism on the basis of the measurement result of the alignment mark.

The exposure unit 30 may comprise two substrate stages 207 and 208 to parallelly execute measurement and exposure. This arrangement can be called a twin-stage arrangement. For example, while the first substrate is exposed using one substrate stage 207, the second substrate to be exposed next can be measured using the other substrate stage 208. After the exposure of the first substrate and the measurement of the second substrate are completed, the two substrate stages 207 and 208 are swapped, and the second substrate is exposed. During this time, the first substrate can be exchanged with the third substrate to be exposed next, and the third substrate is measured.

The exposure apparatus 200 comprises a surface position sensor 209 for measuring the surface position of the substrate. A preferable example of the surface position sensor 209 is an oblique-incidence sensor. The oblique-incidence sensor obliquely irradiates the substrate with a light beam, and measures the surface position of the substrate on the basis of the position where the light beam reflected by the substrate enters its light-receiving surface.

The original conveyance mechanism 210 conveys, for example, an externally provided original to the prealignment unit 202, or a used original from the original stage 203 to an external device.

The substrate conveyance mechanism 211 conveys, for example, an externally provided substrate onto the substrate stage 207 or 208, or an exposed substrate to an external device.

The components 202 to 209, original conveyance mechanism 210, and substrate conveyance mechanism 211 as described above are connected to an information processing apparatus 201 by wire or wireless communication.

Figure 3:
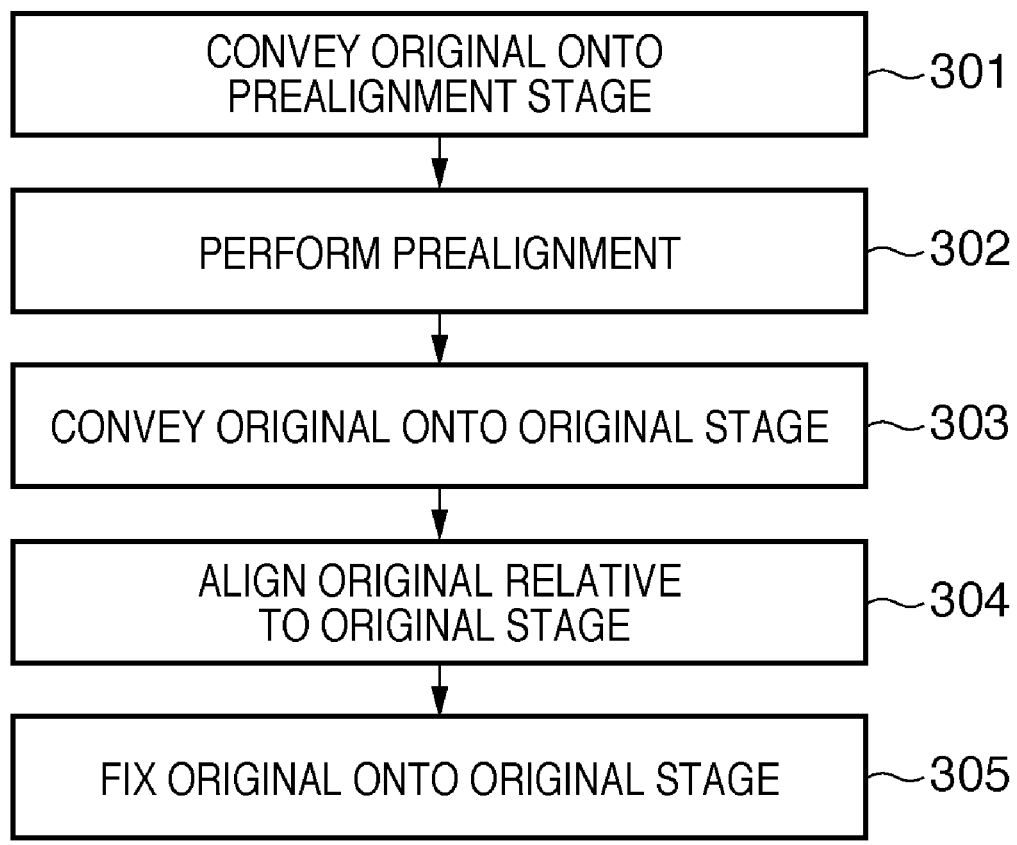
FIG. 3 is a flowchart for explaining the operation of an original conveyance mechanism.

FIG. 3 is a flowchart for explaining the operation of the original conveyance mechanism 210. An original can be provided from the outside (typically, a stocker) of the exposure apparatus to a predetermined port of the exposure apparatus by a conveyance robot. In step 301, the original is conveyed onto a prealignment stage of the prealignment unit 202 by the original conveyance mechanism 210.

In step 302, the prealignment unit 202 observes a probe mark of the original, thereby adjusting the position of the prealignment stage so that the probe mark matches a reference position.

In step 303, the original on the prealignment stage is conveyed onto the original stage 203.

In step 304, the original alignment unit 204 observes the alignment mark on the original, and drives the original stage 203 on the basis of the observation result, thereby correcting the positional relationship between the original and the original stage 203 in the x-axis direction, y-axis direction, and θ (rotation angle) direction.

In step 305, the original is fixed by vacuum chucking by the original stage 203.

Figure 1:
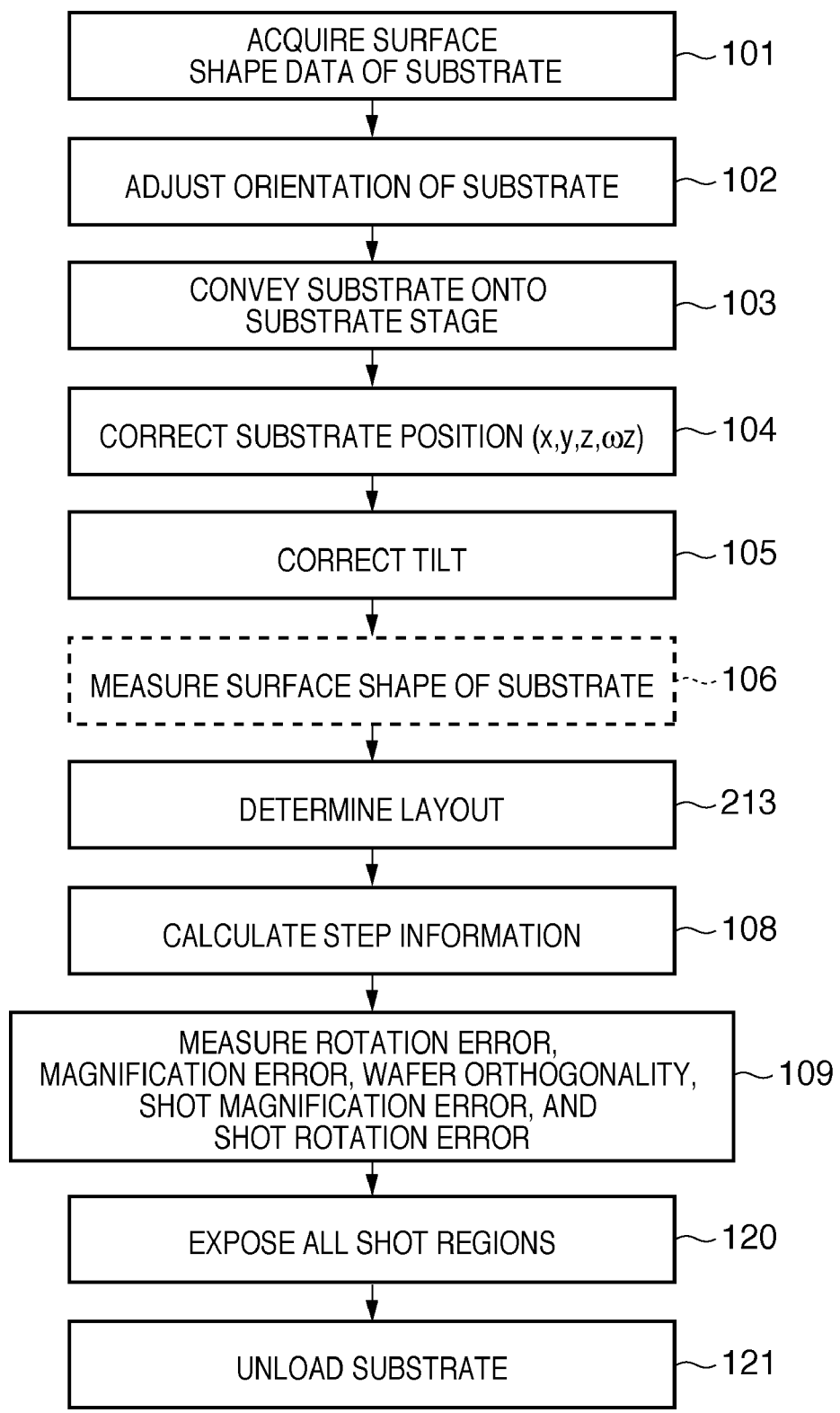
FIG. 1 is a flowchart illustrating the operation of an exposure apparatus according to a preferred embodiment of the present invention.

FIG. 1 is a flowchart illustrating the operation of the exposure apparatus 200. The process shown in FIG. 1 is controlled by the controller 40. The exposure apparatus 200 receives an externally conveyed substrate. If the substrate has already undergone surface shape measurement by, for example, an external inspection apparatus before being loaded into the exposure apparatus 200, the controller 40 can receive the surface shape measurement result (surface shape data representing the surface shape). For example, if the substrate is received inline from a CD (Coater/Developer) connected to the exposure apparatus, this information can be received from the inspection apparatus in synchronism with an inline signal with the CD. Alternatively, this information can be received from a host in the factory or an MC (Machine Component) via an online IF (not shown) of the exposure apparatus 200 before or after substrate reception. Note that it is a common practice to connect the MC to both the CD and the exposure apparatus via the online IF.

The process operation in step 101 can be optionally executed when the surface shape of the substrate is measured by a device outside the exposure apparatus.

As the substrate is loaded into the exposure apparatus 200, a mechanical prealignment unit (not shown) of the exposure apparatus 200 detects the outer shape specifications (e.g., an orientation flat and notch) of the substrate in step 102. On the basis of the detection result, the orientation (rotation angle θ) of the substrate is adjusted so that the substrate is oriented along a direction designated in a recipe. After that, the substrate is conveyed onto a fine moving stage of the substrate stage 207 by the substrate conveyance mechanism 211 (step 103).

In step 104, the substrate position is corrected. More specifically, the alignment mark on the substrate arranged on the fine moving stage of the substrate stage 207 or 208 is observed, thereby detecting the shift amount of the substrate position (the position in the x, y, z, and ωz directions). On the basis of the detection result, the fine moving stage of the substrate stage 207 or 208 is driven so that the alignment mark comes within the field of the alignment scope 206.

In step 105, the tilt of the substrate is corrected. In this process, a surface position measuring sensor (measuring unit) 109 measures the level (focus position) of the center of each of a plurality of sample shots designated in the recipe. On the basis of the measurement result, the tilt of the substrate is calculated, and a command is issued to a driving unit of the fine moving stage of the substrate stage 207 or 208 to correct the calculated tilt.

In step 106, the surface shape of the substrate is measured. The surface shape can be measured by measuring the level (the position of the projection optical system 205 in the optical axis direction) of the representative position, for example, the central position of each shot region. This measurement can be performed using the surface position sensor (measuring unit) 209. If the surface shape of the substrate is measured by an external device, the surface shape data of the substrate may be acquired from the external device (step 101).

In step 213, the controller 40 determines a shot layout on the basis of the surface shape data of the substrate. This determination can be performed by a layout determining unit 41 of the controller 40. Details of shot layout selection will be described later.

In step 108, the controller 40 calculates the pattern step of the substrate surface (resist surface) for each of a plurality of sample shots, and average step information common between these shots is calculated. The surface position sensor 209 can also be used to calculate this pattern step.

In step 109, one or several alignment marks formed at one or several points in the x and y directions in a shot are measured for each of the plurality of sample shots using the alignment scope 206. On the basis of the measurement result, the shift amount, rotation error, magnification error, orthogonality, shot magnification error, and shot rotation error of the substrate are determined.

In step 120, the substrate is aligned on the basis of the information (measurement result) obtained in step 109, and exposed. The plurality of shot regions on the substrate are exposed in accordance with the shot layout determined in step 213.

After all shot regions have been exposed, the substrate conveyance mechanism 211 conveys the substrate from the substrate stage 208 to the outside of the exposure apparatus 200.

Figure 4:
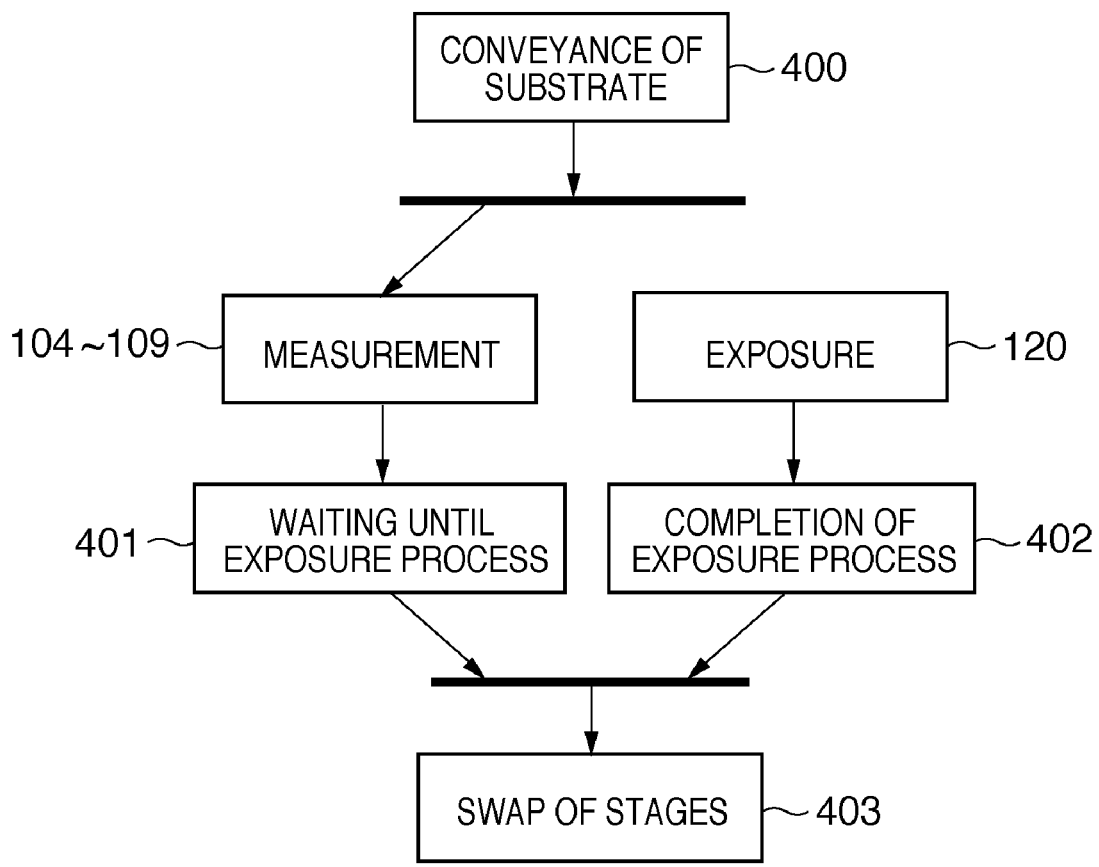
FIG. 4 is a flowchart schematically showing how to parallelly execute exposure and measurement in a twin-stage arrangement.

FIG. 4 is a flowchart schematically showing how to parallelly execute exposure and measurement in a twin-stage arrangement having the two substrate stages 207 and 208. In the exposure apparatus having a twin-stage arrangement, while exposure is performed using one substrate stage (step 120), a substrate is conveyed from an external device onto the other substrate stage, and measurement is performed using the other substrate stage (steps 104 to 109). After the process waits until both the exposure and the measurement are completed (steps 401 and 402), the two substrate stages are swapped (step 403).

Figures 7A, 7B:
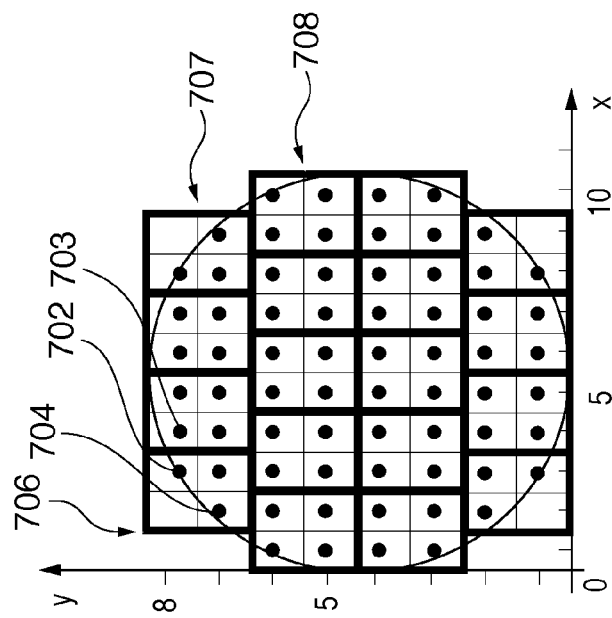
FIGS. 7A and 7B are a diagram and table for explaining substrate surface shape measurement.

FIGS. 7A and 7B are a diagram and table for explaining substrate surface shape measurement. For the sake of descriptive simplicity, the accuracies of the x-coordinate, y-coordinate, and Z value are simplified and their units are not clearly shown herein. In practice, these accuracies and units are on the order of nanometers. The Z value represents the difference in level between each shot region and the exposure reference plane (the image plane of the projection optical system 205) on the substrate. For example, the plus sign indicates an upward shift from the exposure reference plane, and the minus sign indicates a downward shift from the exposure reference plane.

Assume that the surface shape of the substrate is measured (step 106) at solid dots 702, 703, and 704 or other solid dots shown in FIG. 7A. At each measurement point, the x and y coordinates and the difference from the exposure reference plane on the substrate in the level direction can be obtained as data. For example, portions (measurement points), on the substrate, where the surface shape of the substrate is measured and their number can be designated in a recipe or determined by detecting a measurement mark formed on the substrate in advance. If a device outside the exposure apparatus performs the measurement, information indicating the measurement result can be provided from the external device to the exposure apparatus in step 101.

FIGS. 7A and 7B are a diagram and table schematically illustrating the substrate surface shape measurement result. For example, the measurement point 702 indicated by a solid dot lies at a position (x,y)=(3,8) on the substrate. The difference in level between the substrate surface and the exposure reference plane at this measurement point is 0.1. When compared with shot layout data in the recipe, for example, the measurement point 702 is specified as belonging to a first shot 706. Note that the first to the nth shots are defined in turn from the upper left to the lower right herein. Likewise, the measurement point 703 indicated by a solid dot lies at a position (x,y)=(4,8) on the substrate. The difference in level between the substrate surface and the exposure reference plane at this measurement point is 0.2. The measurement point 703 is specified as belonging to a second shot from the layout information in the recipe. FIG. 7B shows surface shape data corresponding to only 24 measurement points. However, in practice, when the measurement is performed at the measurement points indicated by solid dots shown in FIG. 7A, surface shape data corresponding to 68 measurement points are obtained. The surface shape data illustrated in FIG. 7B are obtained in step 101 or 106.

Figure 5:
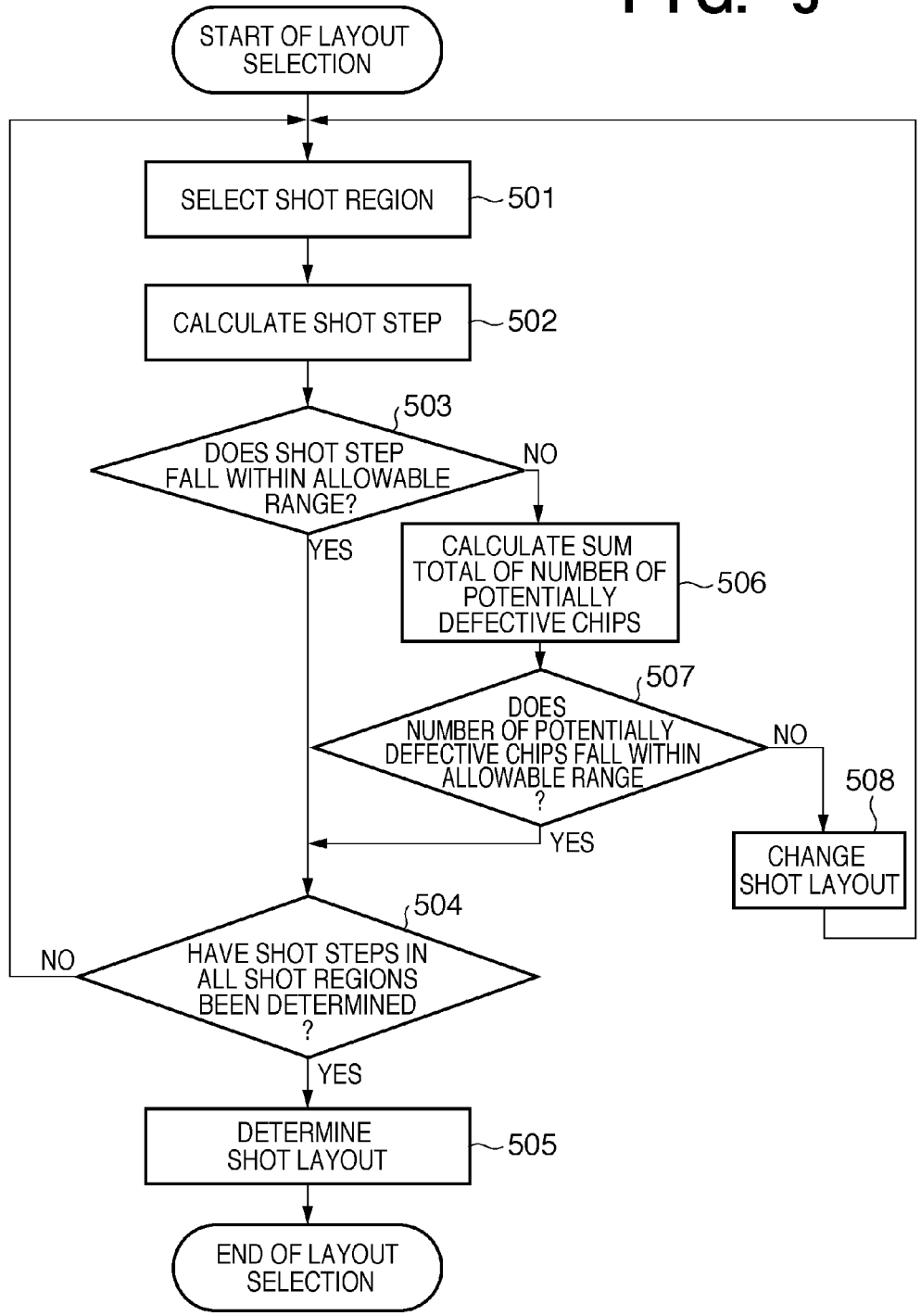
FIG. 5 is a flowchart illustrating the first detailed example of a shot layout determination process by a layout determining unit.

FIG. 5 is a flowchart illustrating the first detailed example of a shot layout determination process by the layout determining unit 41 (step 213).

In step 501, one shot region is selected from all shot regions. In step 502, a step (shot step) in the selected shot region is calculated. This shot step can be calculated on the basis of the surface shape data at a position belonging to the shot region. This shot step can be calculated on the basis of the surface shape data as illustrated in FIGS. 7A and 7B, which are obtained in step 101 or 106 of FIG. 1.

For example, according to the measurement result (surface shape data) illustrated in FIGS. 7A and 7B, the shot step in shot 1 (a shot of a shot No.=1) ranges from −0.2 to 0.1. Likewise, the shot step in shot 2 ranges from 0.1 to 0.2, that in shot 3 ranges from −0.3 to 0.2, and that in shot 4 ranges from −0.4 to 0.3.

In step 503, it is determined whether the shot step calculated in step 502 described above falls within an allowable range. The allowable range of the shot step can be given as a recipe or apparatus constant in advance. For example, if the allowable range is 0, the shot steps in all shots 1, 2, 3, and 4 fall outside the allowable range. For example, if the allowable range falls within 0.3, the shot steps in shots 1 and 2 fall within the allowable range, and those of shots 3 and 4 fall outside the allowable range. For the sake of descriptive simplicity, the accuracies and units of values representing the shot step described herein are simplified, and numerical values and units of higher accuracies can be used in practice.

If the shot step falls outside the allowable range, the number of chips included in the shot region is counted as the number of potentially defective chips in step 506. For example, if one shot region includes four chip regions, "4" is added to the previous count value as the number of potentially defective chips. In step 507, it is determined whether the number of potentially defective chips falls within an allowable range. The allowable range of the number of potentially defective chips is preferably designated as a recipe or apparatus constant in advance. If the number of potentially defective chips exceeds this designated value, the shot layout is changed in step 508.

The shot layout is changed in step 508 in, for example, the following way. As the first method, a plurality of shot layouts (e.g., a type which assigns greatest importance to throughput, a type which ensures both throughput and accuracy, and a type which assigns greatest importance to accuracy) are defined in a recipe, as will be described later. The shot layout can be changed by switching from, for example, a type which assigns greatest importance to throughput to one which ensures both throughput and accuracy, or to one which assigns greatest importance to accuracy. Examples of the shot layouts of the respective types will be described in detail separately.

As the second method, the shot layout is changed by automatically generating a new one.

When the process operation in step 508 is complete, the process returns to step 501 because the shot steps in all shot regions in the changed shot layout must be newly determined.

If YES in step 503 or 507, it is determined whether the shot steps in all the shot regions have been determined. If a shot region is present which has not yet undergone determination, the process returns to step 501. In step 501, the shot region which has not yet undergone determination is selected. The process operations in step 502 and subsequent steps are executed for the selected shot region.

If it is determined in step 504 that the shot steps in all the shot regions have been determined, the shot layout determined at this point is determined as the final shot layout in step 505.

FIGS. 8A to 8E are diagrams illustrating shot layout candidates which can be selected in the shot layout determination process by the layout determining unit 41 (step 213). The number of shots and the measurements to be performed can be decreased when exposure can be performed in accordance with a shot layout according to which of a plurality of chip regions can be exposed at once over the entire surface of the substrate by one shot. Hence, the adoption of such a shot layout allows increase of the number of substrates which can be exposed per unit time by the exposure apparatus (throughput).

Figure 8C:
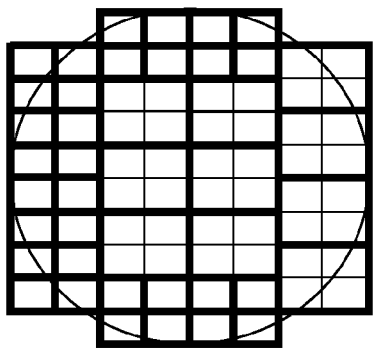
FIGS. 8A to 8E are diagrams illustrating shot layout candidates which can be selected in the shot layout determination process by the layout determining unit.
Figure 8E:
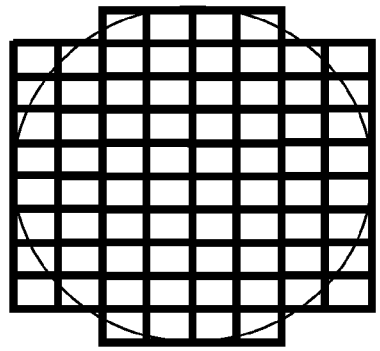
Figure 8B:
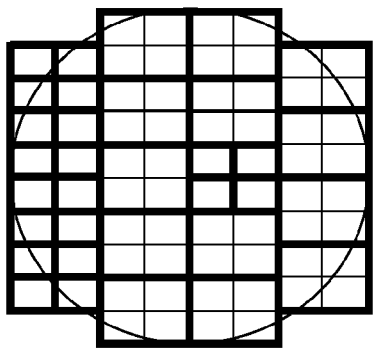
Figure 8A:
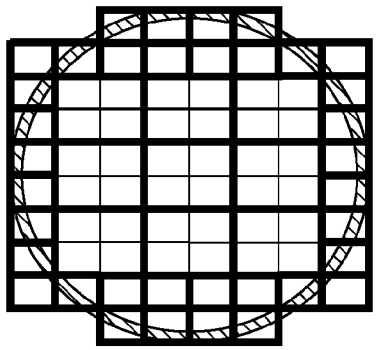
Figure 8D:
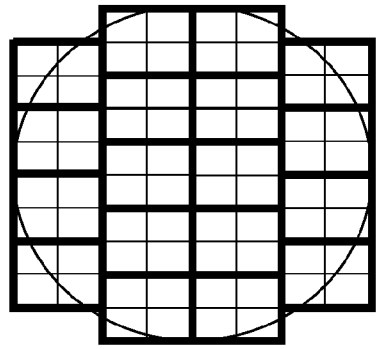

FIG. 8D illustrates a shot layout according to which four chips can be exposed by one shot. The shot layout illustrated in FIG. 8D is assumed as a type which assigns a greatest importance to throughput. On the other hand, the shot layout shown in FIG. 8A is often adopted because the substrate often has an uneven surface in, for example, its peripheral portion. The shot layout illustrated in FIG. 8A takes account of a case in which the substrate has unevenness in its peripheral portion indicated by the hatched portion. Defective chips are less likely to be generated when a shot region in a largely uneven portion is set as small as possible, and one chip is exposed by one shot. However, throughput in this case is lower than that in the shot layout shown in FIG. 8D. The shot layout shown in FIG. 8A is assumed as a type which ensures both throughput and accuracy.

To further assure extremely satisfactory chips (to further suppress the generation of defective chips), a layout according to which a shot region is set as small as possible so that defective chips are less likely to be generated is conceivable, as illustrated in FIG. 8E. However, throughput in this case is significantly lower than those in the cases shown in FIGS. 8D and 8A. The shot layout shown in FIG. 8E is assumed as a type which assigns a greatest importance to accuracy.

Conventionally, the operator must select in advance one shot layout from the shot layout candidates as illustrated in FIGS. 8D, 8A, and 8E in a recipe.

However, according to the preferred embodiment of the present invention, a shot layout is determined for each substrate on the basis of the surface shape (more specifically, the shot step) of the substrate.

A shot layout which can be generated when the shot layout is changed by automatically generating a new one will be exemplified. In general, the operator empirically designates the shot layout illustrated in FIG. 8D, 8A, or 8E. However, even if the substrate has unevenness in, for example, its peripheral portion, the unevenness does not always extend over the entire peripheral portion of the substrate. In this case, the shot layout as illustrated in FIG. 8C may be effective. If unevenness randomly appears in, for example, the vicinity of the center of the substrate, the shot layout as shown in FIG. 8B may be most suitable.

However, the shot layouts illustrated in FIGS. 8B and 8C cannot be designated by the operator in advance, and are individually generated by measuring the surface shape of each substrate.

Figure 6:
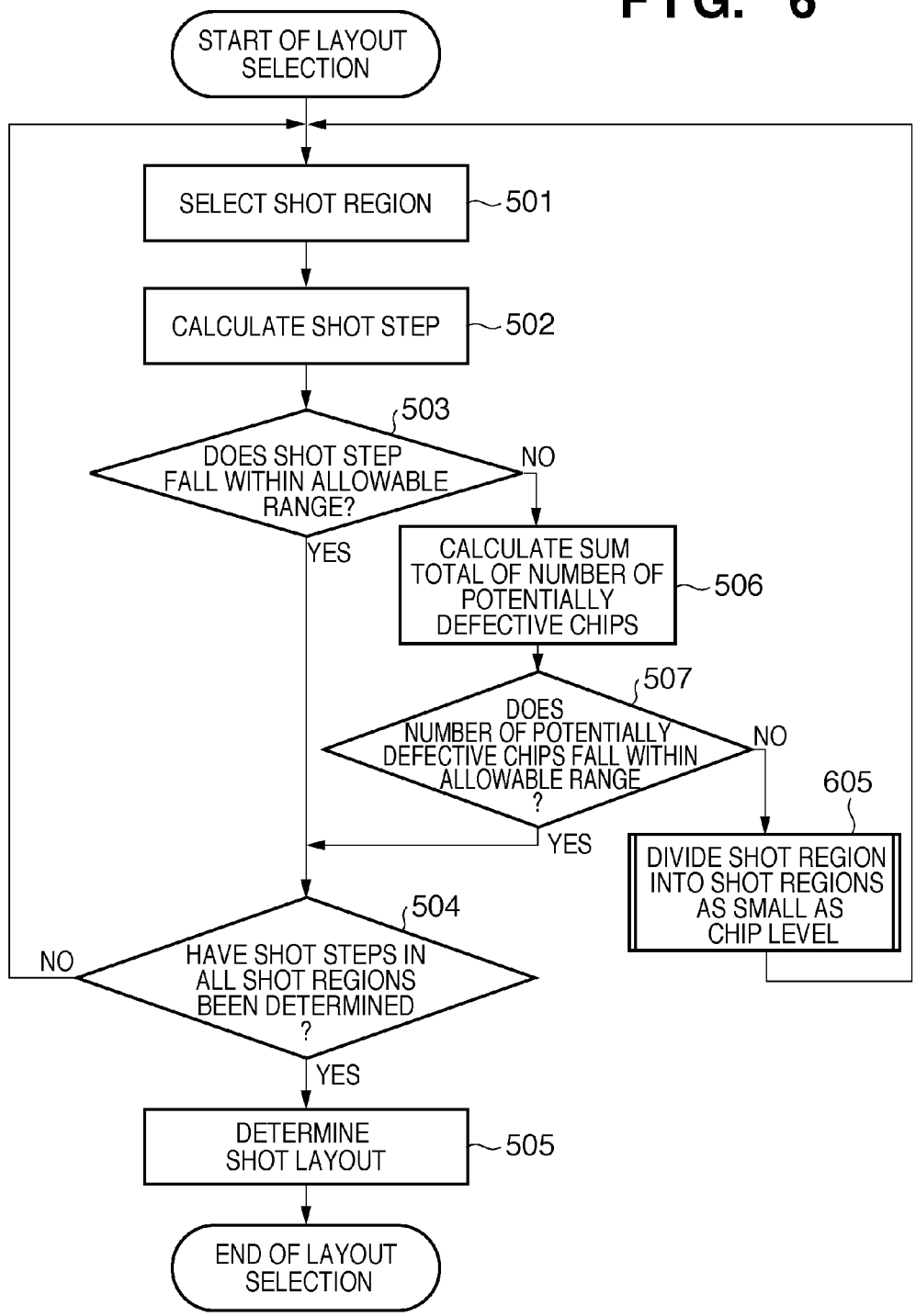
FIG. 6 is a flowchart illustrating the second detailed example of the shot layout determination process by the layout determining unit.

FIG. 6 is a flowchart illustrating the second detailed example of the shot layout determination process by the layout determining unit 41 (step 213). In this process, the shot layout is changed by automatically generating a new one on the basis of the surface shape of each substrate. The process operation in step 605 of FIG. 6 substitutes for that in step 508 of FIG. 5.

If it is determined in step 507 that the number of potentially defective chips falls outside the allowable range, a shot region the shot step of which is determined in step 503 to fall outside the allowable range is divided into shot regions as small as the chip level in step 605. Alternatively, the shot region may be divided into smaller shot regions including two or more chip regions.

For example, consider a case in which the shot layout shown in FIG. 8D is initially given, and shots 1, 2, 3, 4, and 12 are determined in step 503 as shot regions, the shot steps of which fall outside the allowable range. In this case, when these shot regions are divided into shot regions as small as the chip level, the shot layout as illustrated in FIG. 8B is obtained.

Consider another case in which the shot layout as shown in FIG. 8D is initially given, and shots 1 to 4, 5, 9, 10, and 14 are determined in step 503 as shot regions the shot steps of which fall outside the allowable range. In this case, when these shot regions are divided into shot regions as small as the chip level, the shot layout as illustrated in FIG. 8C is obtained. As described above, the process illustrated in FIG. 6 divides a shot region into shot regions as small as the chip level (or smaller shot regions including two or more chip regions).

APPLICATION EXAMPLE

A device (e.g., a semiconductor integrated circuit device or liquid crystal display device) is manufactured via an exposure step of exposing a substrate coated with a photosensitive agent to radiant energy using the exposure apparatus according to the above-described embodiment, a development step of developing the exposed substrate, and a known step of processing the substrate before the exposure step and/or after the development step.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2007-188664, filed Jul. 19, 2007, which is hereby incorporated by reference herein in its entirety.

What is claimed is:
1. An exposure apparatus for exposing each shot region on a substrate to radiant energy, the apparatus comprising:

a controller configured to determine a shot layout information that defines a size and a position of each shot region based on data representing a surface shape of the substrate, so that a step, obtained from the data, in the each shot region falls within an allowable range, wherein the shot layout information is determined by dividing a shot region, of which the obtained step falls outside the allowable range, into smaller shot regions each of which includes at least one chip region; and an exposure unit configured to expose each shot region to the radiant energy in accordance with the determined shot layout information.

2. The apparatus according to claim 1, wherein the controller is configured to determine the shot layout information by selecting one from a plurality of candidates of the shot layout information based on the data.

3. The apparatus according to claim 1, wherein the controller is configured to generate the shot layout information by dividing a shot region defined in a candidate of the shot layout information based on the data.

4. The apparatus according to claim 1, wherein the controller is configured to determine the shot layout information with respect to each substrate.

5. The apparatus according to claim 1, further comprising a measuring device configured to measure the surface shape and to generate the data.

6. An information processing apparatus for determining a shot layout information that defines a size and a position of each shot region on a substrate to be exposed to radiant energy by an exposure apparatus, wherein the information processing apparatus is configured to determine the shot layout information based on data representing a surface shape of the substrate, so that a step, obtained from the data, in the each shot region falls within an allowable range, wherein the shot layout information is determined by dividing a shot region, of which the obtained step falls outside the allowable range, into smaller shot regions each of which includes at least one chip region.

7. The apparatus according to claim 6, wherein the apparatus is configured to determine the shot layout information by selecting one from a plurality of candidates of the shot layout information based on the data.

8. The apparatus according to claim 6, wherein the apparatus is configured to generate the shot layout information by dividing a shot region defined in a candidate of the shot layout information based on the data.

9. A method of manufacturing a device, the method comprising:

exposing a substrate to radiant energy using the exposure apparatus according to claim 1;

developing the exposed substrate; and processing the developed substrate to manufacture the device.

10. The method according to claim 9, wherein the controller of the exposure apparatus is configured to determine the shot layout information by selecting one from a plurality of candidates of the shot layout information based on the data.

11. The method according to claim 9, wherein the controller of the exposure apparatus is configured to generate the shot layout information by dividing a shot region defined in a candidate of the shot layout information based on the data.

12. The method according to claim 9, wherein the controller of the exposure apparatus is configured to determine the shot layout information with respect to each substrate.

13. The method according to claim 9, wherein the exposure apparatus further comprises a measuring device configured to measure the surface shape and to generate the data.

* * * * *